(12) United States Patent
Liao et al.

(10) Patent No.: US 6,821,872 B1
(45) Date of Patent: Nov. 23, 2004

(54) METHOD OF MAKING A BIT LINE CONTACT DEVICE

(75) Inventors: Chien-Mao Liao, Pan-Chiao (TW); Shing-Yih Shih, Chung-Ho (TW); Chang-Rong Wu, Pan-Chiao (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/709,852

(22) Filed: Jun. 2, 2004

(51) Int. Cl.[7] ................. H01L 21/3205; H01L 21/4763
(52) U.S. Cl. ................. 438/586; 438/587; 438/588; 438/597; 438/618; 438/624; 438/637; 438/639; 438/666; 438/697; 438/699; 438/702; 438/782
(58) Field of Search ................. 438/256, 399, 438/586–588, 597–599, 618, 621, 624, 633, 637, 639–640, 666, 692, 697–700, 702, 761, 782, 787

(56) References Cited

U.S. PATENT DOCUMENTS 6,444,554 B1 * 9/2002 Adachi et al. ............. 438/587
6,573,168 B2 * 6/2003 Kim et al. ................. 438/586
6,649,510 B2 * 11/2003 Lee ............................. 438/618

* cited by examiner

Primary Examiner—Lynne A. Gurley
(74) Attorney, Agent, or Firm—Winston Hsu (57) ABSTRACT

A method for making a bit line contact on a substrate is provided. Two gate conductor stacks are formed on a main surface of the substrate in close proximity to each other. A bit line contact forming area is defined above the area between the two gate conductor stacks. A silicon dioxide lining film is deposited on a top surface and sidewalls of the gate conductor stacks. A sacrificing layer is deposited on the silicon dioxide lining film. The sacrificing layer is then polished to expose the top surface of the gate conductor stacks. A spin-on-glass (SOG) film is then coated on the sacrificing layer. A resist pattern masking the bit line contact forming area is formed on the SOG film. The un-masked SOG film, sacrificing layer and silicon dioxide lining film are etched away. A silicon nitride thin film is deposited on the remaining SOG film. A BPSG layer is deposited on the silicon nitride thin film and is then polished to expose the SOG layer. The exposed SOG layer and the underlying sacrificing layer are removed to form a bit line contact hole.

8 Claims, 13 Drawing Sheets

METHOD OF MAKING A BIT LINE CONTACT DEVICE

BACKGROUND OF INVENTION

1. Field of the Invention

The present invention generally relates to semiconductor processes, and more particularly to a method for fabricating a bit line contact between two adjacent gate conductor stacks by utilizing a sacrificial polysilicon layer and spin-on glass (SOG) during the fabrication of a Trench-DRAM device.

2. Description of the Prior Art

A memory chip is an integrated circuit (IC) made of millions of transistors and capacitors. In the most common form of computer memory, dynamic random access memory (DRAM), a MOS transistor and a storage capacitor are paired to create a memory cell, which represents a single bit of data. Memory cells are etched onto a silicon wafer in an array of columns (bit liners) and rows (word lines). The intersection of a bitline and wordline constitutes the address of the memory cell. The storage capacitor holds the bit of information. The MOS transistor acts as a switch that lets the control circuitry on the memory chip read the storage capacitor or change its state. The storage capacitor typically comprises a top electrode, a storage node, and a capacitor dielectric layer. As DRAMs are manufactured with increasing densities, the memory cells necessarily are made smaller and smaller and packed closer and closer together to pack as much memory into as small a space as possible. The increased density drives the word lines (or bit lines) closer tog-ether increasing the coupling between adjacent lines and also challenges the conventional lithographic methods for transferring tiny feature images such as a bit line contact pattern.

Figure 1:
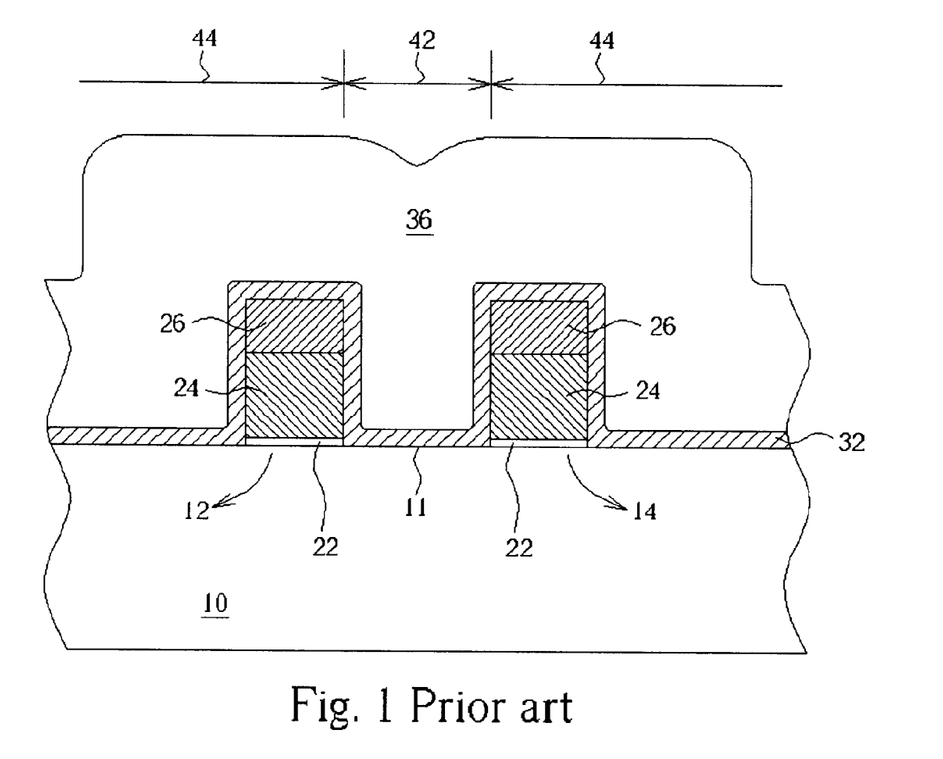
FIG. 1 to FIG. 5 are schematic cross-sectional diagrams illustrating a conventional method for fabricating a bit line contact between two adjacent gate conductor stacks.

FIG. 1 to FIG. 5 are schematic cross-sectional diagrams illustrating a conventional method for fabricating a bit line contact between two adjacent gate conductor stacks 12 and 14. As shown in FIG. 1, on a main surface 11 of a semiconductor substrate 10, at least two gate conductor stacks 12 and 14 are provided. Each of the gate conductor stacks 12 and 14 generally comprises a gate dielectric layer 22, a conductive layer 24 and a silicon nitride cap layer 26. A bit line contact area 42 and a non-bit line contact area 44 are defined over the gate conductor stacks 12 and 14. The bit line contact area 42 is approximately above the area between the gate conductor stacks; 12 and 14. Typically, after the formation of the gate conductor stacks 12 and 14, a silicon nitride liner 32 is deposited on the semiconductor substrate 10. A borophosphosilicate glass (BPSG) layer 36 is then deposited on the silicon nitride liner 32.

Figure 2:
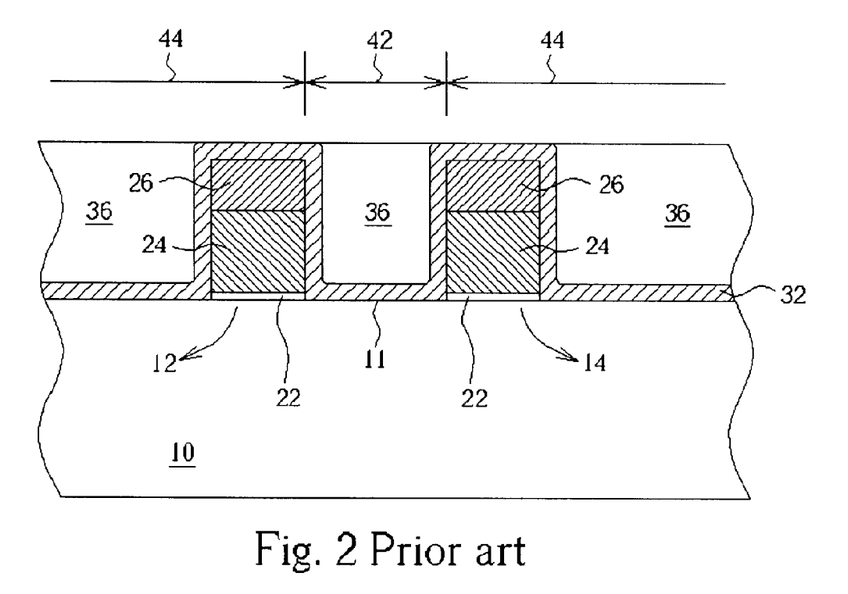
Figure 3:
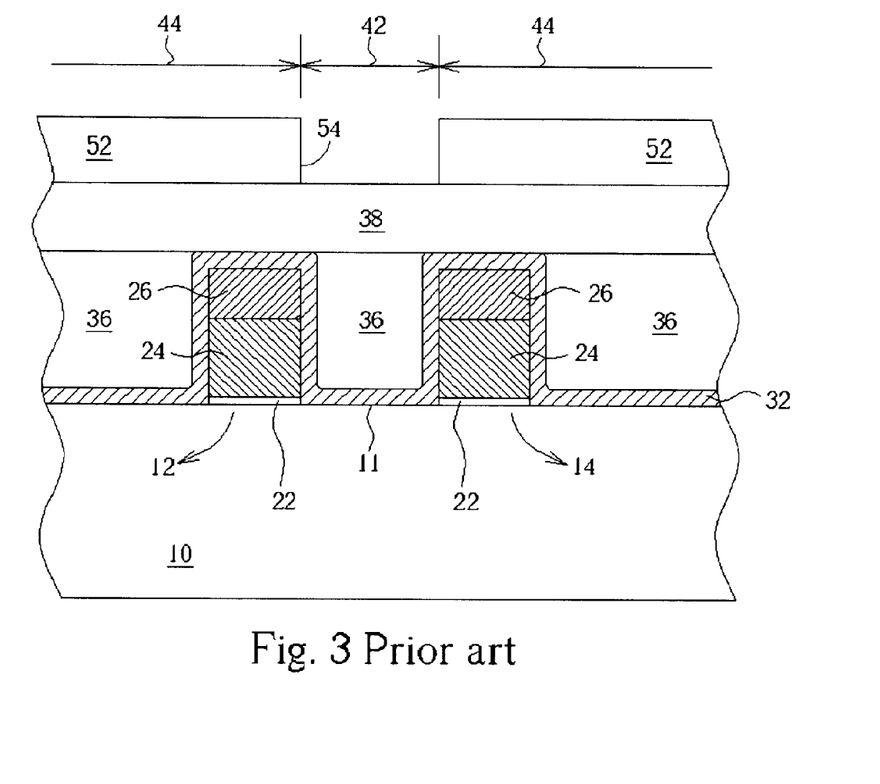

As shown in FIG. 2, a chemical mechanical polishing (CMP) process is then carried out to polish the BPSG layer 36 to the silicon nitride liner 32. As shown in FIG. 3, a TEOS-oxide layer 38 is deposited on the remaining BPSC layer 36 and on the exposed silicon nitride liner 32. A photoresist pattern 52 is then formed on the TEOS-oxide layer 38 by using conventional lithographic methods. The photoresist pattern 52 has an opening 54 exposing the bit line contact area 42 between the gate conductor stacks 12 and 14.

Figure 4:
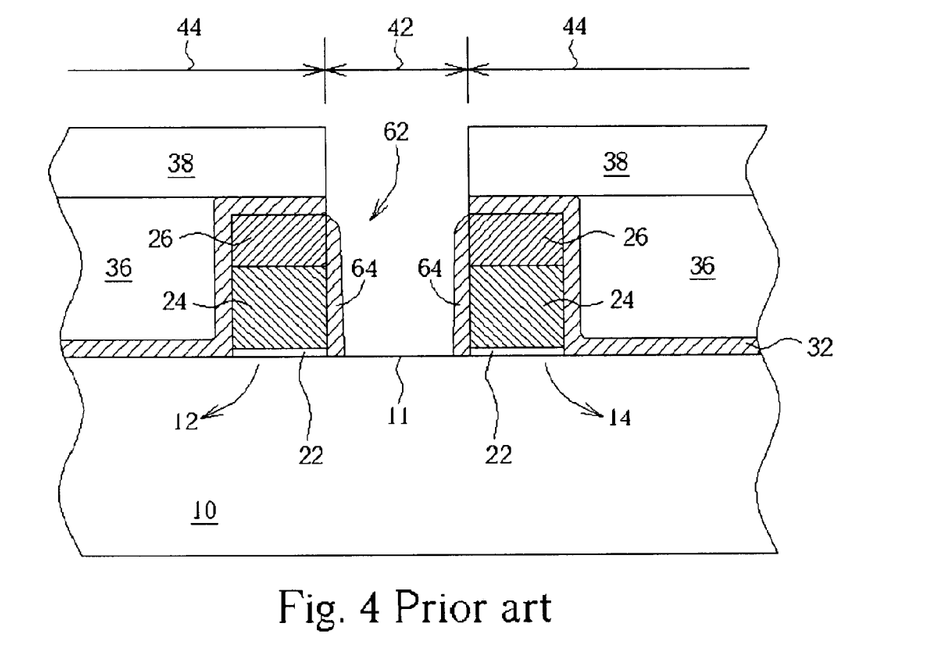

As shown in FIG. 4, using the photoresist pattern 52 as an etching hard mask, an anisotropic etching process is performed to etch the TEOS-oxide layer 38, the BPSG 36 and the silicon nitride liner 32 through the opening 54, thereby forming a bit line contact hole 62. Simultaneously, a silicon nitride spacer 64 is formed on sidewall of the gate conductor stacks 12 and 14. The photoresist pattern 52 is then removed.

Figure 5:
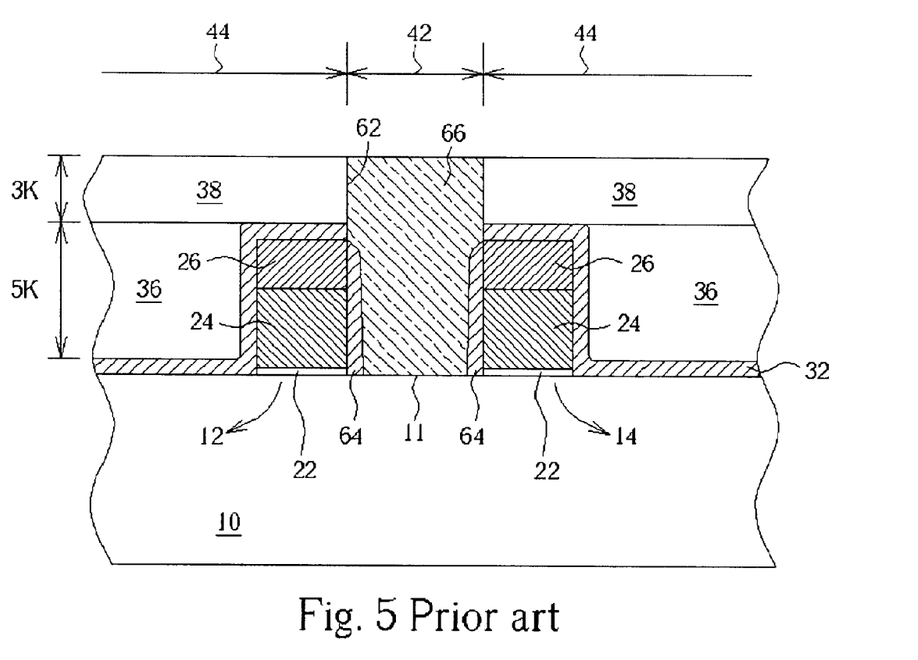

Finally, as shown in FIG. 5, the bit line contact hole 62 is filled with conductive materials such as metals or the like to form a bit line contact plug 64. Generally, the resultant bit line contact plug 64 is about 8000-angstrom height from the main surface 11 of the semiconductor substrate 10. The TEOS-oxide layer 38 has a thickness of about 3000 angstroms.

However, the above-described prior art method has several drawbacks. First, since the shrinkage of the bit line contact area 42, precise and accurate pattern transfer using conventional lithographic methods becomes a major challenge. As the bit line contact area 42 shrinks to below 90 nm, it often needs so-called Imaging Enhancement Technology (IET) to successfully transfer such small bit line contact pattern from a photo mask to a photoresist layer on a wafer. The process window is therefore narrowed. Further, it is difficult to clean up a bit line contact hole having a depth of about 8000 angstroms and a critical dimension of about 90 nm by using dry or wet etching methods. Some undesired residuals might clog the bit line contact hole. Another shortcoming is that the above-described prior art method uses silicon nitride liner 32. A part of the silicon nitride liner 32 is etched into a silicon nitride spacer 64 on sidewall of the gate conductor stacks 12 and 14. In operation, the silicon nitride spacer 64 leads to higher parasitic capacitance, which adversely affects the performance of the memory device.

SUMMARY OF INVENTION

Accordingly, it is the primary object of the present invention to provide a method for fabricating a bit line contact between two adjacent gate conductor stacks by utilizing a sacrificial polysilicon layer and spin-on glass (SOG) during the fabrication of a Trench-DRAM device, thereby solving the above-described problems.

According to the claimed in invention, a method for fabricating a bit line contact hole is provided. A substrate having a main surface is prepared. At least two adjacent gate conductor stacks are provided on the main surface. A bit line contact area and a non-bit line contact area are defined over the main surface. The bit line contact area is directly above an area between the two adjacent gate conductor stacks. Each of the gate conductor stacks has a top surface and sidewalls. A silicon oxide liner is deposited on the top surface and sidewalls of each of the gate conductor stacks. A sacrificial layer is thereafter deposited on the silicon oxide liner. A first chemical mechanical polishing (CMP) is carried out to polish the sacrificial layer. A spin-on-glass (SOG) layer is then coated onto the remaining sacrificial layer and onto the exposed top surface of the gate conductor stacks. A photoresist pattern is formed on the SOG layer masking the bit line contact area. Using the photoresist pattern as a hard mask, the SOG layer, the sacrificial layer, and the silicon oxide liner not covered by the photoresist pattern is etched away. The photoresist pattern is then removed, leaving the SOG layer, the sacrificial layer, and the silicon oxide liner within the bit line contact area intact. A silicon nitride liner is deposited on the SOG layer within the bit line contact area, the partial top surface and sidewalls of the gate conductor stacks. A dielectric layer is then deposited over the silicon nitride liner. A second CMP is performed to polish the dielectric layer to stop on the SOG layer. The remaining SOG layer and the sacrificial layer within the bit line contact area are selectively removed to form the bit line contact hole.

Other objects, advantages, and novel features of the claimed invention will become more clearly and readily

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Please refer to FIG. 6 to FIG. 13. FIG. 6 to FIG. 13 are schematic cross-sectional diagrams showing a method for fabricating a bit line contact between two adjacent gate conductor stacks by utilizing a sacrificial polysilicon layer and spin-on glass (SOG) during the fabrication of a Trench-DRAM device in accordance with one preferred embodiment of the present invention, wherein like numerals designate similar regions, layers or elements.

Figure 6:
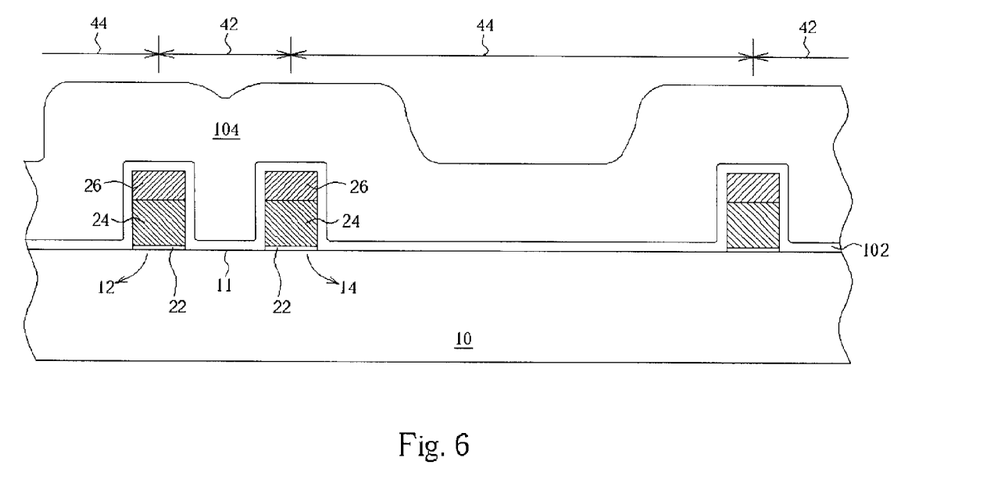
FIG. 6 to FIG. 13 are schematic cross-sectional diagrams showing a method for fabricating a bit line contact between two adjacent gate conductor stacks by utilizing a sacrificial polysilicon layer and spin-on glass (SOG) during the fabrication of a Trench-DRAM device in accordance with one preferred embodiment of the present invention.

As shown in FIG. 6, at least two adjacent gate conductor (GC) stacks 12 and 14 are formed on a main surface 11 of a semiconductor substrate 10. Each of the gate conductor stacks 12 and 14 generally comprises a gate dielectric layer 22, a conductive layer 24 and a silicon nitride cap layer 26. The conductive layer 24 may be made of metals or metal suicide alloys. According to this invention, each of the gate conductor stacks 12 and 14 is about 5000-angstrom height. The silicon nitride cap layer 26 is about 2000-angstrom thick. A bit line contact area 42 and a non-bit line contact area 44 are defined over the gate conductor stacks 12 and 14. The bit line contact area 42 is approximately above the area between the gate conductor stacks 12 and 14. According to this invention, the dimension of the bit line contact area 42 is about 90 nm.

After forming the gate conductor stacks 12 and 14, a chemical vapor deposition (CVD) process is carried out to deposit a silicon dioxide liner 102 over the semiconductor substrate 10. The silicon dioxide liner 102 covers sidewalls and top surface of the gate conductor stacks 12 and 14. Subsequently, a sacrificial polysilicon layer 104 having a thickness of about 4000 angstroms is deposited on the silicon dioxide liner 102.

Figure 7:
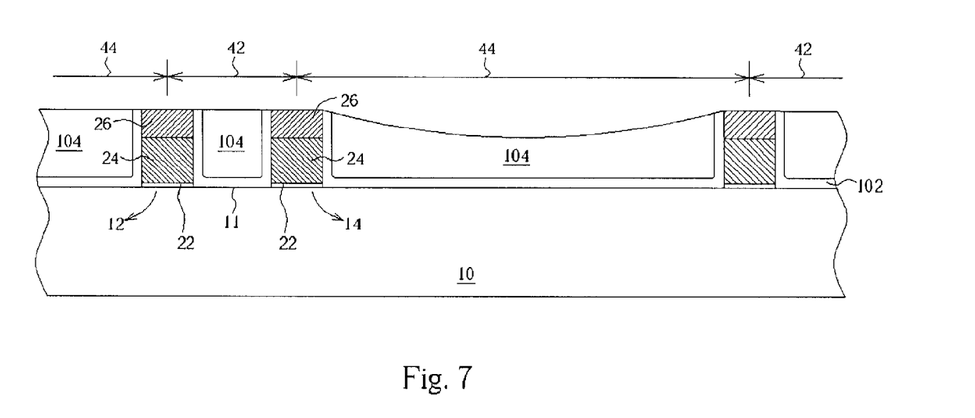

As shown in FIG. 7, a first CMP process is performed to polish the sacrificial polysilicon layer 104 down to the silicon nitride cap layer 26 of the gate conductor stacks 12 and 14. By doing this, a precise end point detection can be obtained because the silicon nitride cap layer 26 of the gate conductor stacks 12 and 14 is used as polishing stop layer during the first CMP process. An optional over-etching may be performed. Another unexpected advantage of using the silicon nitride cap layer 26 of the gate conductor stacks 12 and 14 as polishing stop layer is that an alignment mark (not shown) made of the same layer as the silicon nitride cap layer 26 is also exposed, thus providing precise alignment of the wafer without the fear of interference of the polysilicon layer. The alignment mark fabricated on scribe lines or peripheral areas of a die or a chip is known in the art. It is noteworthy that after the first CMP, as specifically indicated in FIG. 7, dishing phenomenon on the sacrificial polysilicon layer 104 may be observed within the non-bit line contact area 44.

Figure 8:
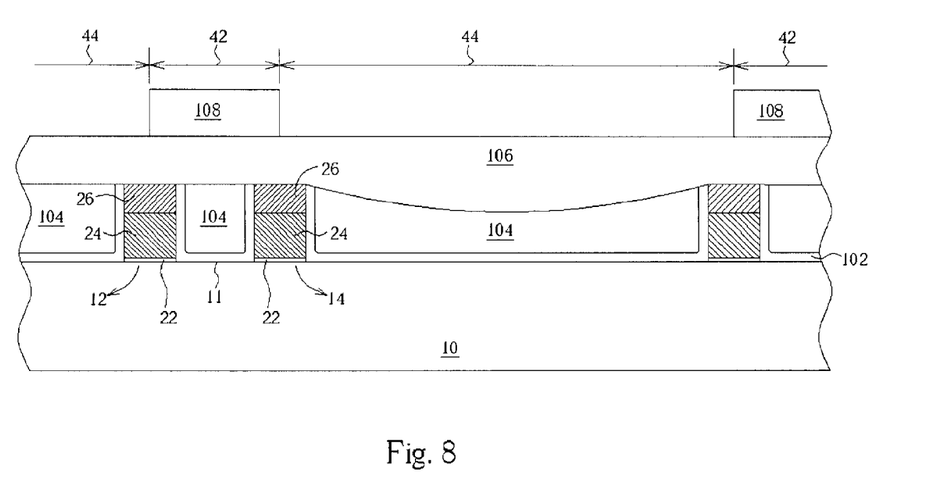

As shown in FIG. 8, a layer of spin-on glass (SOG) 106 is coated on the semiconductor substrate 10. The SOG layer 106 has a thickness of about 3000 angstroms and covers the silicon nitride cap layer 26 of the gate conductor stacks 12 and 14, the remaining sacrificial polysilicon layer 104, and the exposed silicon dioxide liner 102. A photoresist pattern 108 is then formed on the SOG layer 106 by using conventional lithographic methods. The photoresist pattern 108 masks the bit line contact area 42 directly above the area between the two adjacent gate conductor stacks 12 and 14, while the non-bit line contact area 44 is exposed. It is advantageous to use the present invention method because the SOG layer 106 provides uniform and planar surface for the photoresist pattern 108. Besides, the SOG layer 106 compensates the slightly recessed dishing area over the sacrificial polysilicon layer 104 in the non-bit line contact area 44.

Figure 9:
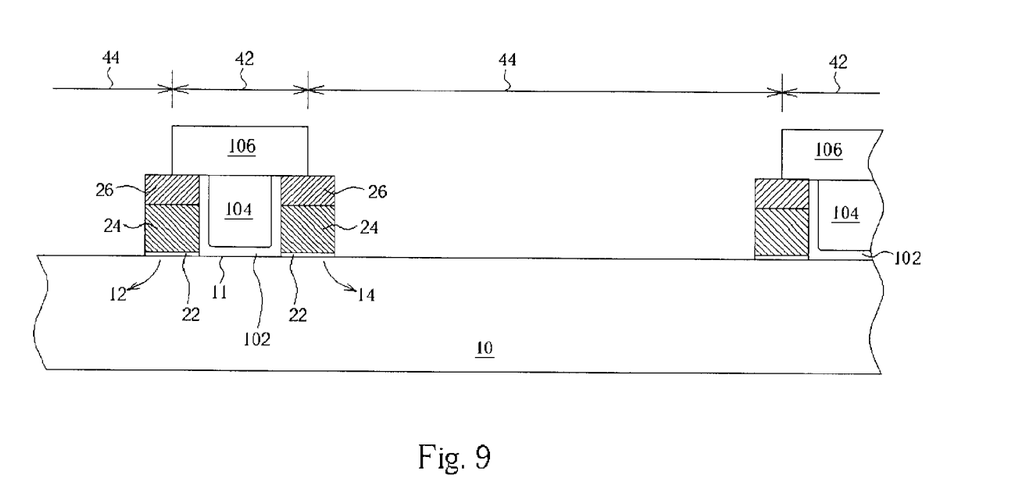

As shown in FIG. 9, using the photoresist pattern 108 and the silicon nitride cap layer 26 together as an etching hard mask, a conventional dry etching process is carried out to etch away the SOG layer 106, the sacrificial polysilicon layer 104, and silicon dioxide liner 102, which are not masked by the photoresist pattern 108, leaving the SOG layer 106, the sacrificial polysilicon layer 104 and silicon dioxide liner 102 within the bit line contact area 42 intact. The photoresist pattern 108 is then removed.

Figure 10:
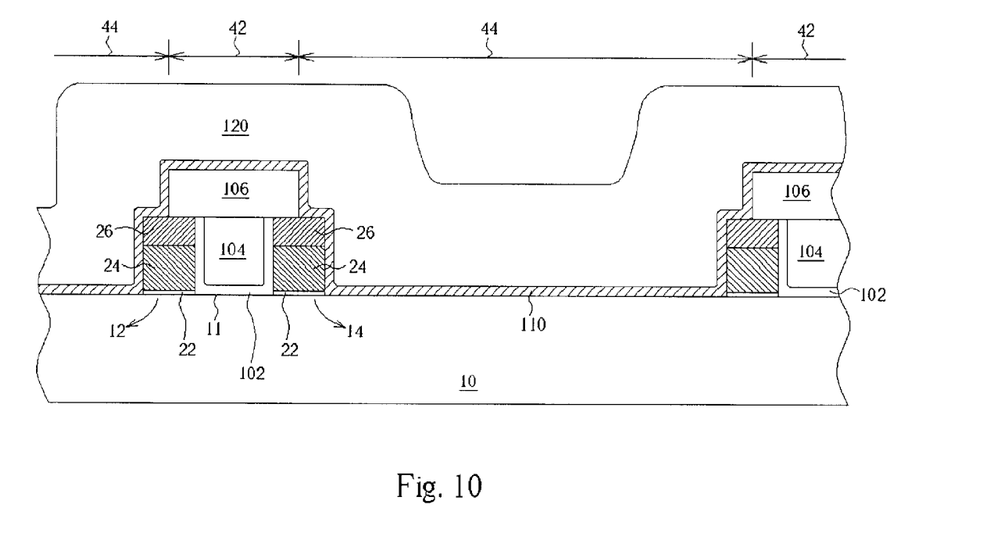

As shown in FIG. 10, a thin silicon nitride liner 110 is then deposited on the semiconductor substrate 10 by CVD methods. The thin silicon nitride liner 110 covers the exposed main surface 11 of the substrate 10, a part of the top surface and sidewalls of the gate conductor stacks 12 and 14, and the remaining SOG layer 106. A CVD process is performed to deposit a borophosphosilicate glass (BPSG) layer 120 over the thin silicon nitride liner 110. The BPSG layer 120 has a thickness of about 4000~8000 angstroms.

Figure 11:
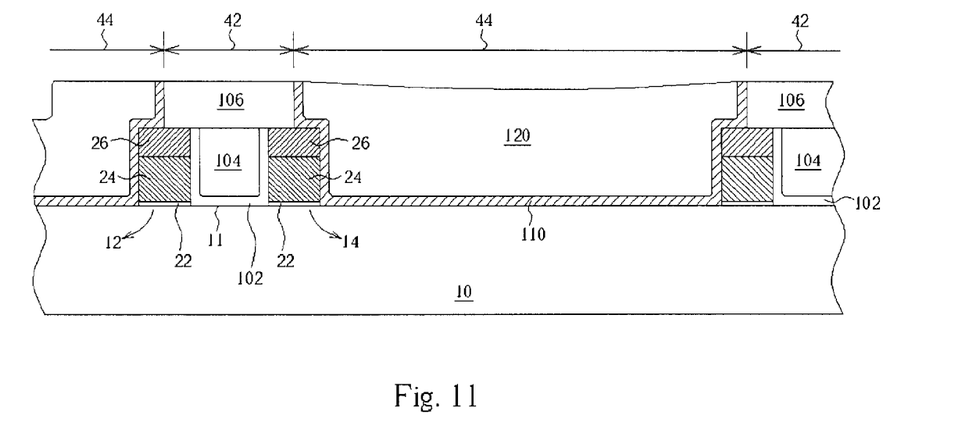

As shown in FIG. 11, a second CMP is carried out to polish the BPSG layer 120. The second CMP is terminated when the SOG layer 106 is exposed. It is noted that the thin silicon nitride liner 110 within the bit line contact area 42 is removed.

Figure 12:
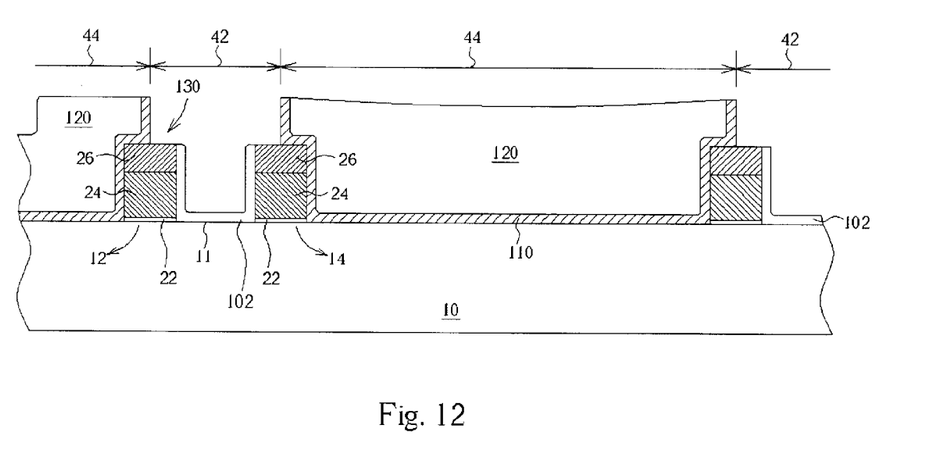

As shown in FIG. 12, the remaining SOG layer 106 and the sacrificial polysilicon layer 104 are selectively removed from the bit line contact area 42 so as to form a bit line contact hole 130.

Figure 13:
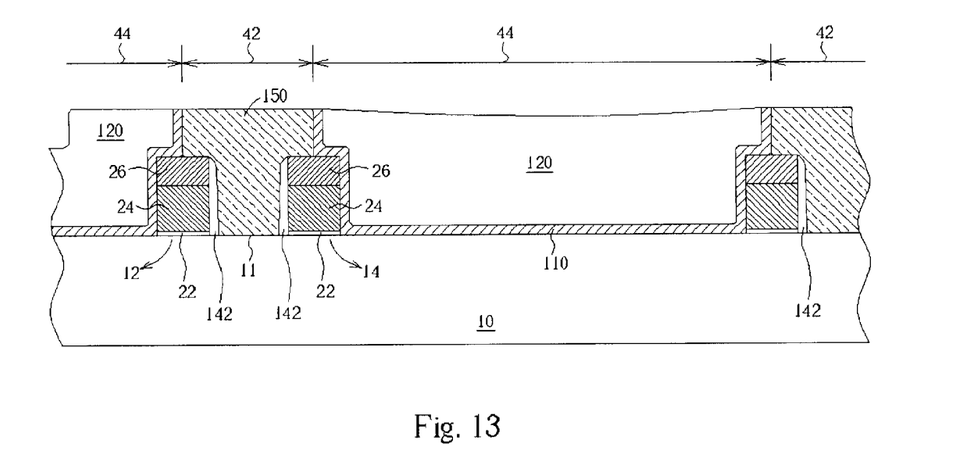

As shown in FIG. 13, subsequently, an anisotropic dry etching process is performed to etch the silicon dioxide liner 102, thereby exposing the silicon main surface 11 within the bit line contact hole 130 and forming silicon dioxide spacers 142 on sidewalls of the gate conductor stacks 12 and 14. Finally, the bit line contact hole 130 is filled with conductive materials such as metals or the like to form a bit line contact plug 150.

Those skilled in the art will readily observe that numerous modifications and alterations of the present invention method may be made while retaining the teaching of the invention. Accordingly, the above disclosure should be construed as limited only by the metes and bounds of the appended claims.

What is claimed is:

1. A method for fabricating a, bit line contact hole, comprising:

providing a substrate having a main surface, on which at least two adjacent gate conductor stacks are provided, wherein a bit line contact area and a non-bit line contact area are defined over the main surface, wherein the bit line contact area is directly above an area between the two adjacent gate conductor stacks, and wherein each of the gate conductor stacks has a top surface and sidewalls;

depositing a silicon oxide liner on the top surface and sidewalls of each of the gate conductor stacks;

depositing a sacrificial layer on the silicon oxide liner;

performing a first chemical mechanical polishing (CMP) to polish the sacrificial layer to the top surface of the gate conductor stacks;

coating a spin-on-glass (SOG) layer onto the remaining sacrificial layer and onto the exposed top surface of the gate conductor stacks;

forming a photoresist pattern on the SOG layer masking the bit line contact area;

using the photoresist pattern as a hard mask, etching the SOG layer, the sacrificial layer, and the silicon oxide liner not covered by the photoresist pattern;

removing the photoresist pattern leaving the SOG layer, the sacrificial layer, and the silicon oxide liner within the bit line contact area intact;

depositing a silicon nitride liner on the SOG layer within the bit line contact area, the partial top surface and sidewalls of the gate conductor stacks;

depositing a dielectric layer over the silicon nitride liner;

performing a second CMP to polish the dielectric layer to stop on the SOG layer; and selectively removing the remaining SOG layer and the sacrificial layer within the bit line contact area to form the bit line contact hole.

2. The method according to claim 1 wherein the sacrificial polysilicon layer is made, of polysilicon.

3. The method according to claim 2 wherein the sacrificial layer is about 4000-angstrom thick.

4. The method according to claim 1 wherein each of the gate conductor stacks comprises a gate dielectric layer, a conductive layer and a silicon nitride cap layer.

5. The method according to claim 4 wherein the conductor layer comprises polysilicon.

6. The method according to claim 4 wherein the conductive.

7. The method according to claim 1 wherein the dielectric layer is a borophosphosilicate glass (BPSG) layer.

8. The method according to claim 1 wherein the SOG layer is about 3000-angstrom thick.

* * * * *